US005812748A

United States Patent [19]
Ohran et al.

[11] Patent Number: 5,812,748
[45] Date of Patent: Sep. 22, 1998

[54] METHOD FOR IMPROVING RECOVERY PERFORMANCE FROM HARDWARE AND SOFTWARE ERRORS IN A FAULT-TOLERANT COMPUTER SYSTEM

[75] Inventors: Richard S. Ohran, Provo; Richard N. Rollins; Michael R. Ohran, both of Orem; Wally Marsden, Provo, all of Utah

[73] Assignee: Vinca Corporation, Orem, Utah

[21] Appl. No.: 442,415

[22] Filed: May 16, 1995

Related U.S. Application Data

[63] Continuation-in-part of Ser. No. 94,755, Jul. 20, 1993, abandoned, and a continuation-in-part of Ser. No. 81,391, Jun. 23, 1993, abandoned.

[51] Int. Cl.$^6$ ............................................. G06F 11/00
[52] U.S. Cl. ............................. 395/182.02; 395/180.09; 395/182.11; 395/183.05
[58] Field of Search ................................ 395/800, 181, 395/183.05, 182.08, 182.11, 182.13, 182.09, 182.02, 800.01

[56] References Cited

U.S. PATENT DOCUMENTS

| | | | |
|---|---|---|---|
| 5,005,122 | 4/1991 | Griffin et al. | 364/200 |
| 5,157,663 | 10/1992 | Major et al. | 371/9.1 |
| 5,276,867 | 1/1994 | Kenley et al. | 395/600 |
| 5,307,481 | 4/1994 | Shiazaki et al. | 395/575 |
| 5,343,477 | 8/1994 | Yamada | 371/8.2 |
| 5,403,639 | 4/1995 | Belsan et al. | 395/600 |
| 5,404,508 | 4/1995 | Konrad et al. | 395/600 |
| 5,408,649 | 4/1995 | Beshears et al. | 395/575 |
| 5,455,932 | 10/1995 | Major et al. | 395/489 |
| 5,513,314 | 4/1996 | Kandasamy et al. | 395/182.04 |
| 5,515,502 | 5/1996 | Wood | 395/182.13 |
| 5,530,855 | 6/1996 | Satoh et al. | 395/600 |
| 5,533,191 | 7/1996 | Nakam | 395/182.09 |
| 5,537,533 | 7/1996 | Staheli et al. | 395/182.03 |
| 5,537,585 | 7/1996 | Blickenstaff et al. | 395/600 |
| 5,544,347 | 8/1996 | Yanai et al. | 395/489 |
| 5,572,709 | 11/1996 | Fowler et al. | 395/500 |

OTHER PUBLICATIONS

"White Paper—Compaq On–Line Recovery Server, Executive Summary," *Compaq*, Sep. 1995.
Dinman, S. B., "Micro backup*devices: protecting your data from equipment failure," *Government Computer News*, vol. 7, No. 19, p. 85(5).
Gershen, "RAID and Reliability," *RS Magazine*, Sep. 1992.
Bolles, "A RAID Stack: Micropolis' Raidion," *Network Computing*, Jun. 1992.
Sullivan, "NCR Disk Array Software Supports Multilevel RAID.".

(List continued on next page.)

*Primary Examiner*—Alyssa H. Bowler
*Assistant Examiner*—Walter D. Davis, Jr.
*Attorney, Agent, or Firm*—Workman Nydegger Seeley

[57] ABSTRACT

A method for providing rapid recovery from a network file server failure through the use of a backup computer system. The backup computer system runs a special mass storage access program that communicates with a mass storage emulator program on the network file server, making the disks (or other mass storage devices) on the backup computer system appear like they were disks on the file server computer. By mirroring data by writing to both the mass storage of the file server and through the mass storage emulator and mass storage access program to the disks on the backup computer, a copy of the data on the file server computer is made. Optionally, selected portions of the data read through the mass storage emulator program can be altered before being returned as the result of the read operation on the file server. In the event of failure of the file server computer, the backup computer can replace the file server, using the copy of the file server's data stored on its disks. A single backup computer can support a plurality of file server computers. Unlike other redundant file server configurations, this method does not require the backup computer system to be running the file server operating system.

26 Claims, 9 Drawing Sheets

OTHER PUBLICATIONS

Busse, "High–end Sanyo Disk System Offers Multiple RAID Levels," *News/Networking,* Sep. 28, 1992.

Gilloly, "Firm Offers High–end Mass Storage System for LANS.".

Costlow, "DG Sets Up RAID Unit," *Electronic Engineering Times,* Sep. 21, 1992.

Dryden, "Fail–safe Subsystems Grow, RAID Components Shipping," *News & Analysis,* Sep. 12, 1992.

Alford, "Disk Arrays Explained," *Byte,* Oct. 1992.

Francis, "Getting Ready for PC RAID," *Datamation,* May 15, 1992.

Carr, "An Array of Protection for Server Data," *Data Communications,* May 1992.

O'Brien, RAID 7 Architecture Features Asynchronous Data Transfers, *Computer Technology Review,* Spring 1992.

Lawrence, "No More Data Loss: the BYTE Lab Tests Six Disk–Array Subsystems," *Byte,* Aug., 1992.

McGee, "Hidden Expense," *System and Network Integration,* Jun. 29, 1992.

Costlow, "RAID Launch Gains Momentum," *Electronic Engineering Times,* 1992.

Dryden, "Users Cite RAID's Benefits and Concerns," *LAN Times,* May 25, 1992.

Bowden, "RAID: The Next Step in Disk Subsystems," *LAN Times,* May 25, 1992.

Robinson, "Network Disk Drives Help Efficiency," *Computing,* Oct. 4, 1992.

Patterson, et al., A Case for Redundant Arrays for Inexpensive Disks (RAID), *Report No. UCB.CSD 87/391,* Dec. 1987.

Bhide et al., "A Highly Available Network File Server", USENIX—Winter '91, pp. 199–200, 203–205, 1991.

Steinberg, "Diverting Data from Disaster", *Digital Review,* v8, n35, Nov. 1991, p. 47.

METHOD FOR IMPROVING RECOVERY PERFORMANCE FROM HARDWARE AND SOFTWARE ERRORS IN A FAULT-TOLERANT COMPUTER SYSTEM

CROSS-REFERENCES TO RELATED APPLICATIONS

This is a continuation-in-part of U.S. patent applications with Ser. No. 08/094,755, filed Jul. 20, 1993, now abandoned, and Ser. No. 08/081,391 filed Jun. 23, 1993, now abandoned.

BACKGROUND OF THE INVENTION a. Field of the Invention

This invention relates to fault-tolerant computer systems, and in particular to the methods used to recover from a computer failure in a system with redundant computers each with its own mass storage system(s). This invention facilitates recovery from both hardware and software faults.

b. Description of Related Art

It is often desirable to provide continuous operation of computer systems, particularly file servers which support a number of user workstations or personal computers on a network. To achieve this continuous operation, it is necessary for the computer system to be tolerant of software and hardware problems or faults. This is generally done by having redundant computers and redundant mass storage systems, such that a backup computer or disk drive is immediately available to take over in the event of a fault.

A number of techniques for implementing a fault-tolerant computer system are described in Major et al, U.S. Pat. No. 5,157,663, which is hereby incorporated by reference in its entirety, and Major's cited references. In particular, the invention of Major provides a replicated network file server capable of recovering from the failure of either the computer or the mass storage system of one of the two file servers. It has been used by Novell to implement its SFT-III fault-tolerant file server product.

FIG. 1 illustrates the hardware configuration for a fault-tolerant computer system 100, such as described in Major. There are two server computer systems 110 and 120 connected to network 101, from which they receive requests from client computers. While we refer to computers 110 and 120 as "server computer systems" or simply "servers" and show them in that role in the examples herein, this should not be regarded as limiting the present invention to computers used only as servers for other computer systems.

Server computer system 110 has computer 111 which includes a central processing unit and appropriate memory systems and other peripherals. Server computer system 120 has computer 121 which includes a central processing unit and appropriate memory systems and other peripherals. Mass storage systems 112 and 113 are connected to computer 111, and mass storage systems 122 and 123 are connected to computer 121. Mass storage systems 112 and 123 are optional devices for storing operating system routines and other data not associated with read and write requests received from network 101. Finally, there is an optional communications link 131 between computers 111 and 121.

The mass storage systems can be implemented using magnetic disk drives, optical discs, magnetic tape drives, or any other medium capable of handling the read and write requests of the particular computer system.

An operating system or other control program runs on server computer systems 110 and 120, executed by computers 111 and 121, respectively. This operating system handles server requests received from network 101 and controls mass storage systems 112 and 113 on server 110, and mass storage systems 122 and 123 on server 120, as well as any other peripherals attached to computers 111 and 121.

While FIG. 1 illustrates only two server computer systems 110 and 120, because that is the most common (and lowest cost) configuration for a fault-tolerant computer system 100, configurations with more than two server computer systems are possible and do not depart from the spirit and scope of the present invention.

In normal operation, both server computer system 110 and server computer system 120 handle each mass storage write request received from network 101. Server computer system 110 writes the data from the network request to mass storage system 113, and server computer system 120 writes the data from the network request to mass storage system 122. This results in the data on mass storage system 122 being the mirror image of the data on mass storage system 113 and the states of server computer systems 110 and 120 are generally consistent. In the following discussion, the process of maintaining two or more identical copies of information on separate mass storage systems is referred to as "mirroring the information".

(For read operations, either server computer system 110 or server computer system 120 can handle the request without involving the other server, since a read operation does not change the state of the information stored on the mass storage systems.)

Although computer system 100 provides a substantial degree of fault tolerance, when one of server computer systems 110 or 120 fails, the fault tolerance of the system is reduced. In the most common case of two server computer systems, as illustrated by FIG. 1, the failure of one server computer system results in a system with no further tolerance to hardware faults or many software faults.

In a fault-tolerant computer system such as described above, it is necessary after a failed server computer system has been restored to bring the previously-failed computer system into a state consistent with the server computer system that has continued operating. This requires writing all the changes made to the mass storage system of the non-failing server to the mass storage system of the previously-failed server so that the mass storage systems again mirror each other. Until that has been accomplished, the system is not fault tolerant even though the failed server has been restored.

If a server has been unavailable due to its failure for a period of time during which there have been only a limited number of changes made to the mass storage system of the non-failing server, it is possible for the non-failing server to remember all the changes made (for example, by keeping them in a list stored in its memory) and forward the changes to the previously-failed server when it has been restored to operation. The previously-failed server can then update its mass storage system with the changes and make it consistent with the non-failing server. This process typically does not cause excessive performance degradation to the non-failing server for any substantial period of time.

However, if there have been more changes than can be conveniently remembered by the non-failing server, then the non-failing server must transfer all the information from its mass storage system to the previously-failed server for writing on its mass storage system in order to ensure that the two servers are consistent. This is a very time consuming and resource-intensive operation, especially if the non-failing server must also handle server requests from the network while this transfer is taking place. For very large mass storage systems, as would be found on servers commonly in use today, and with a reasonably high network request load, it might be many hours before the mass storage systems are again consistent and the system is again fault tolerant. Additionally, the resource-intensiveness of the recovery operation can cause very substantial performance degradation of the non-failed server in processing network requests.

Another problem that may occur in the prior art is a software fault that simultaneously halts processing on both of computers 111 and 121. Such a software fault could be a catastrophic software failure that takes down both computers 111 and 121 when those computers are running the Novell SFT-III product.

SUMMARY OF THE INVENTION

It is an object of the present invention to provide tolerance to disk faults even though the computer of a server computer system has failed. This is achieved by electronically switching the mass storage system used for network requests from the failed server computer system to the non-failing server computer system. After the mass storage system from the failed server computer system has been connected to the non-failing server's computer, it is made consistent with the mass storage system of the non-failing server. This is typically a quick and simple operation. From that point on, the mass storage system from the failed server it is operated as a mirrored disk system, with each change being written by the non-failing server's computer to both the non-failing server's original mass storage system and to the mass storage system previously on the failed server and now connected to the non-failing server's computer.

While operating in this mode, the system will no longer be tolerant to processor failures if the non-failing server is the only remaining server (as would be the case in the common two-server configuration described above), but the system would be tolerant to failures of one of the mass storage systems.

It is a further object of the present invention to minimize the time the system is not fault tolerant by eliminating the need for time-consuming copying of the information stored on the mass storage system of the non-failing server to the mass storage of the previously-failed server to make the two mass storage systems again consistent and permit mirroring of information again.

This is also achieved by electronically switching the mass storage system from the failed server computer system to the non-failing server computer system. If this switch is accomplished after there have been only a small number of changes to the mass storage system of the non-failing server, the mass storage system from the failed server computer system can be quickly updated and made consistent, allowing mirroring to resume.

Furthermore, since the mirroring of the invention keeps the information on the mass storage system from the failed server consistent while it is connected to the non-failing sever computer system, when the mass storage system is reconnected to the previously-failed server only those changes made between the time it was disconnected from the non-failed server and when it becomes available on the previously-failed server need to be made before it is again completely consistent and mirroring by the two servers (and full fault tolerance) resumes. This results in avoiding the substantial performance degradation experienced by the non-failing server during recovery using the prior art recovery method described above. As a result, the invention provides rapid recovery from a fault in the system.

It is an object of this invention to provide the rapid recovery from a network file server failure without the complex software of a redundant network file server. This is achieved by having a second, backup computer system with its own mass storage device (generally a magnetic disk). This backup computer is connected by an appropriate means for communications to the file server computer, allowing the transmission of information (such as commands and data) between the two computers. A mass storage emulator, running like a device driver on the file server computer, sends information to a mass storage access program on the backup computer. The mass storage access program performs the requested operation (read, write, etc.) on the mass storage system connected to the backup computer, and returns the result to the mass storage emulator on the file server computer.

This makes the mass storage device on the backup computer look like another mass storage device on the file server computer. The data mirroring option of the file server operating system can be activated (or, if the operating system does not support data mirroring, a special device driver that provides data mirroring can be used), so that a copy of all data written to the mass storage device directly connected to the file server will also be written to the mass storage device on the backup computer, through the mass storage emulator and mass storage access programs.

When a failure is detected in the file server computer system, the backup computer become the file server. The mass storage device of the backup computer will contain a copy of the information on the mass storage device of the failed file server, so the new file server can start with approximately the same data as when the previous file server failed.

It is a further object of this invention to allow a single backup computer to support a plurality of file server computers. This is achieved by having each file server computer run a mass storage emulator. The backup computer can run either a single mass storage access program capable of communicating with a plurality of mass storage emulators. Alternatively, if the operating system on the backup computer permits the running of multiple processes, the backup computer can run a separate mass storage access program for each mass storage emulator.

It is a further object of this invention to improve the reliability of a redundant network file server computer system by reducing the complexity of the software when compared to the software of a redundant network file server. The programs for the mass storage emulator on the file server computer and the mass storage access on the backup computer can be considerably less complex than a full redundant file server operating system.

Furthermore, while it is possible for the backup computer to be running the file server operating system (and acting as another file server), it is also possible to run the mass storage access program under a simple operating system or as a stand-alone program, reducing the complexity and increasing the performance of the backup computer system.

These and other features of the invention will be more readily understood upon consideration of the attached drawings and of the following detailed description of those drawings and the presently preferred embodiments of the invention.

These and other features of the invention will be more readily understood upon consideration of the attached drawings and of the following detailed description of those drawings and the presently preferred embodiments of the invention.

DETAILED DESCRIPTION OF THE INVENTION

Figure 1:
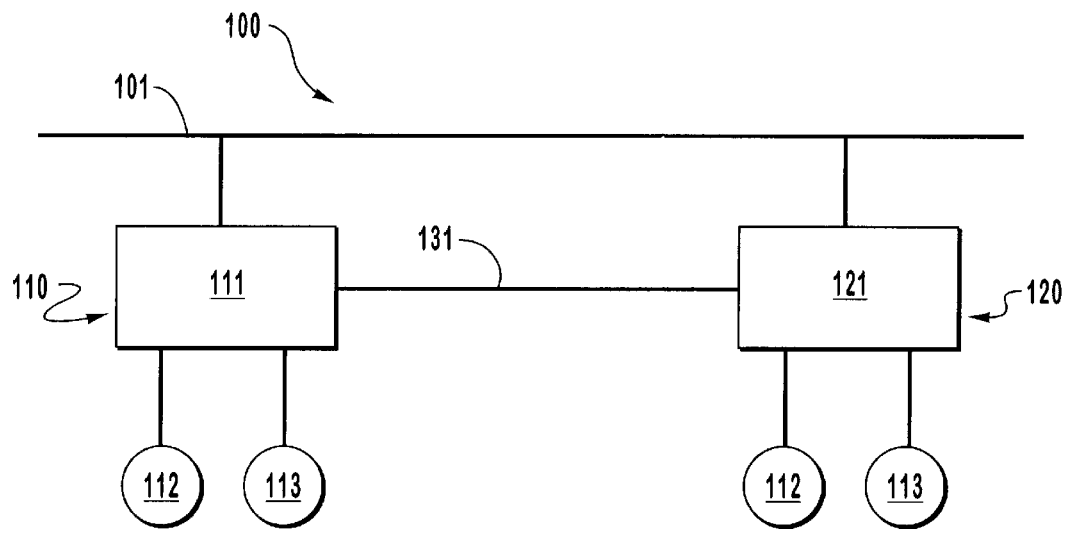
FIG. 1 illustrates a prior art implementation of a fault-tolerant computer system with two server computer systems.
Figure 2:
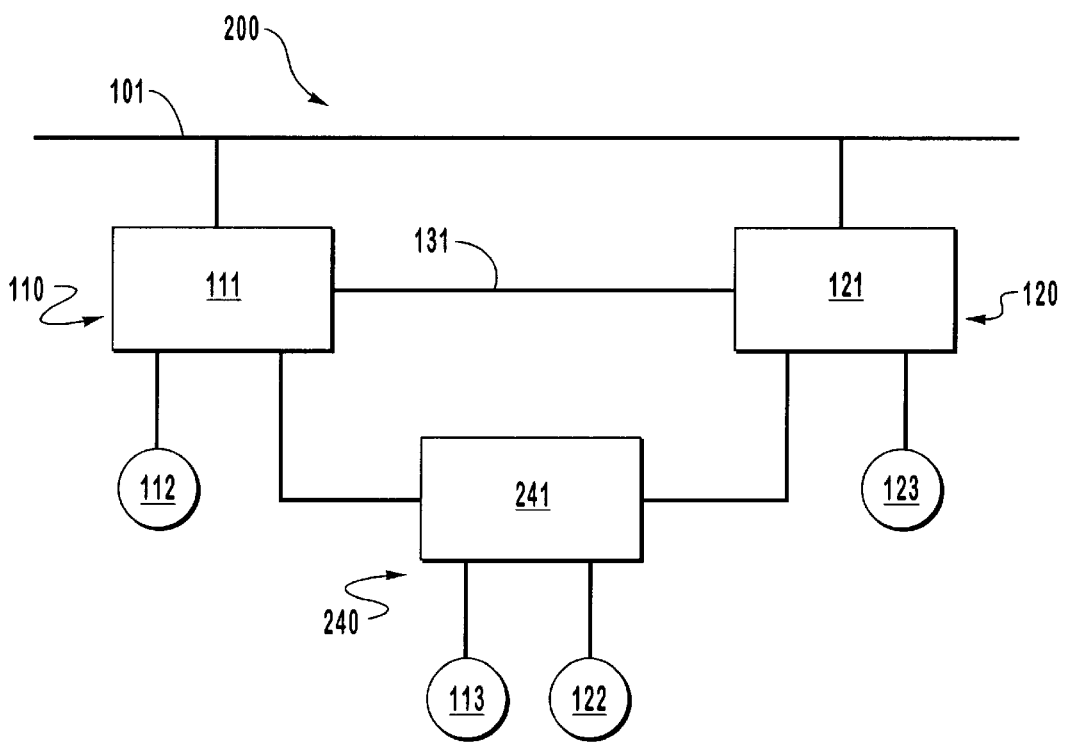
FIG. 2 illustrates the fault-tolerant computer system of FIG. 1, modified to permit the method of the invention by including means for connecting a mass storage system to either server's computer.

Referring to fault-tolerant computer system 200 of FIG. 2, and comparing it to prior art fault-tolerant computer system 100 as illustrated in FIG. 1, we see that mass storage systems 113 and 122, which were used for storing the information read or written in response to requests from other computer systems on network 101, are now part of reconfigurable mass storage system 240. In particular, mass storage system 113 can be selectively connected by connection means 241 to either computer 111 or computer 121 (or possibly both computers 111 and 121, although such dual connection is not necessary for the present invention), and mass storage system 122 can likewise be independently selectively connected to either computer 111 or computer 121 by connection means 241. The mass storage system 240 is reconfigurable because of the ability to select and change connections between mass storage devices and computers.

While FIG. 2 illustrates the most common dual server configuration anticipated by the inventors, other configurations with more than two servers are within the scope of the present invention, and the extension of the techniques described below to other configurations will be obvious to one skilled in the art.

There are a number of ways such connection means 241 can be implemented, depending on the nature of the mass storage system interface to computers 111 or 121. Connection means 241 can be two independent two-channel switches, which electronically connect all the interface signals from a mass storage system to two computers. Such two-channel switches may be a part of the mass storage system (as is common for mass storage systems intended for use with mainframe computers) or can be a separate unit. A disadvantage of using two-channel switches is the large number of switching gates that are necessary if the number of data and control lines in the mass storage interface is large. That number increases rapidly when there are more than two server computer systems in fault-tolerant computer system 200. For example, a fault-tolerant computer system with three computers connected to three mass storage systems would require 2.25 times the number of switching gates as the system illustrated in FIG. 2. (The number of switching gates is proportional to the number of computers times the number of mass storage systems.) The number of switching gates can be reduced by not connecting every mass storage system to every computer, although such a configuration would be less flexible in its reconfiguration ability.

Another implementation of connection means 241 is for both computer 111 and computer 121 to have interfaces to a common bus to which mass storage systems 113 and 122 are also connected. An example of such a bus is the small computer system interface (SCSI) as used on many workstations and personal computers. When a computer wishes to access a mass storage system, the computer requests ownership of the bus through an appropriate bus arbitration procedure, and when ownership is granted, the computer performs the desired mass storage operation. A disadvantage of this implementation is that only one computer (the one with current bus ownership) can access a mass storage system at a time.

If it is desirable to use a standard SCSI bus as means 241 for connecting mass storage systems 113 and 122 to computers 111 and 121, and to allow simultaneous access of the mass storage systems 113 and 122 by their respective server's computers, computers 111 and 121 can each have two SCSI interfaces, one connected to mass storage system 113 and one connected to mass storage system 122. Mass storage system 113 will be on a SCSI bus connected to both computers 111 and 121, and mass storage system 122 will be on a second SCSI bus, also connected to both computers 111 and 121. If computer 111 or computer 121 is not using a particular mass storage system, it will configure its SCSI interface to be inactive on that mass storage systems particular bus.

In the preferred embodiment, a high-speed serial network between computers 111 and 121 and mass storage systems 113 and 122 forms connection means 241. Each computer 111 contains an interface to the network, and requests to a mass storage system 113 or 122 are routed to the appropriate network interface serving the particular mass storage system. Although a bus-type network, such as an Ethernet, could be used, the network of the preferred embodiment has network nodes at each computer and at each mass storage system. Each node can be connected to up to four other network nodes. A message is routed by each network node to a next network node closer to the message's final destination.

For the fault-tolerant computer system configuration of FIG. 2, one network connection from the node at computer 111 is connected to the node for mass storage system 113, and another network connection from the node at computer 111 is connected to the node for mass storage system 122. Similar connections are used for computer 121. Mass storage system 113's node is connected directly to the nodes for computers 111 and 121, and mass storage system 122's node is similarly connected (but with different links) to computers 111 and 121. Routing of messages is trivial, since there is only one link between each computer and each mass storage system.

The particular connecting means 241 used to connect computers 111 and 121 to mass storage systems 113 and 122 is not critical to the method of the present invention, so long as it provides for the rapid switching of a mass storage system from one computer to another without affecting the operation of the computers. Any such means for connecting a mass storage system to two or more computers is usable by the method of the present invention.

Figure 3:
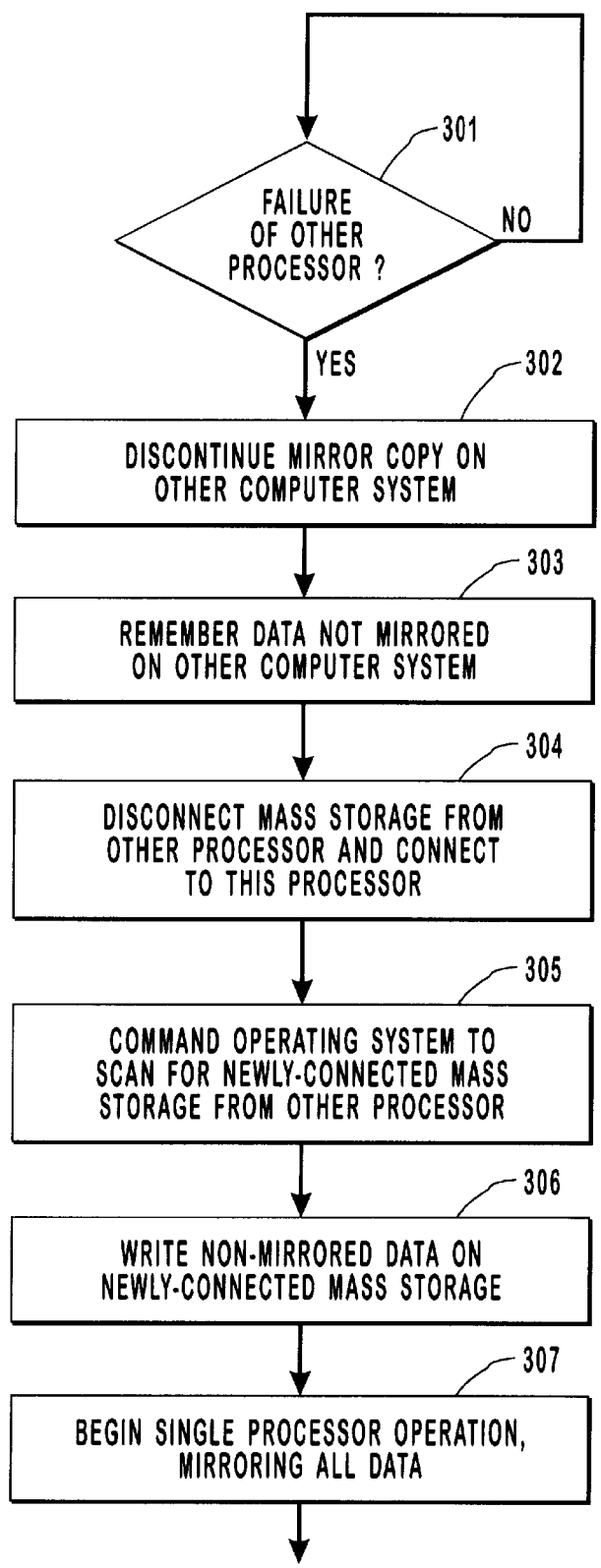
FIG. 3 is a flow diagram illustrating steps which may be taken when a processor failure is detected.

The method of the present invention is divided into two portions, a first portion for reacting to a processor failure and a second portion for recovering from a processor failure. The first portion of the method of the present invention is illustrated by FIG. 3, which is a flow diagram illustrating the steps to be taken when a processor failure is detected. The description of the method provided below should be read in light of FIG. 2. For purposes of illustration, it will be assumed that connection means 241 initially connects mass storage system 113 to computer 111 and mass storage system 122 to computer 121, providing an equivalent to the configuration illustrated in FIG. 1 although the connection means 241 of FIG. 2 facilitates this equivalent configuration. Information mirroring as described above is being performed by computers 111 and 122. It is also assumed that computer 121 has experienced a fault, causing server computer system 120 to fail.

The method starts in step 301, with each computer 111 and 122 waiting to detect a failure of another server's computer 111 and 122. Such failure can be detected by probing the status of the other server's computer by a means appropriate to the particular operating system being used and the communications methods between the servers. In the case of Novell's SFT-III, the method will be running as a NetWare Loadable Module, or NLM, and be capable of communicating directly with the operating system by means of requests. The NLM will make a null request to the SFT-III process. This null request will be such that it will never normally run to completion, but will remain in the SFT-III process queue. (It will require minimal resources while it remains in the process queue.) In the event of a failure of server computer system 121, SFT-III running on server computer system 111 will indicate the failure of the null request to the NLM of the method, indicating the failure of server 121. Because a processor failure has been detected, the method depicted in FIG. 3 proceeds to step 302.

In step 302, detection of the failure of server 121 causes the discontinuation of mirroring information on the failed server 121. This discontinuation can either be done automatically by the operating system upon its detection of the failure of server 121, or by the particular implementation of the preferred embodiment of the method of the present invention. In the case of SFT-III, the discontinuation of mirroring on server 121 is performed by the SFT-III operating system. Step 303 of the method is performed next.

In step 303, SFT-III remembers all data not mirrored on server 121 following its failure as long as the amount of data to be remembered does not exceed the capacity of the system resource remembering the data. If the particular operating system does not remember non-mirrored data, step 303 would have to be performed by the particular implementation of the method of the present invention. The step of remembering all non-mirrored data could be performed by any technique known to persons skilled in the art.

Next, step 304 of the method sets connection means 241 to disconnect mass storage system 122 from computer 121 of failed server 120, and to connect it to computer 111 of non-failing server 110. At this point, the method can quickly test mass storage system 122 to determine if it is the cause of the failure of server 120. If it is, there is no fault-tolerance recovery possible using the method, and mass storage system 122 can be disconnected from computer 111 at connection means 241. If mass storage system 122 is not the cause of server 120's failure, then the cause must be computer 121, and the method can continue to achieve limited fault tolerance in the presence of the computer 121's failure.

Step 305 commands the operating system of server 110 to scan for new mass storage systems, causing the operating system to determine that mass storage system 122 is now connected to computer 111, along with mass storage system 113. SFT-III will detect through information on mass storage systems 113 and 122 that they contain similar information, but that mass storage system 122 is not consistent with mass storage system 113. In step 306, SFT-III will update mass storage system 122 using the information remembered at step 303 and, after the two mass storage systems are consistent (i.e., contain identical mirrored copies of the stored information), step 307 will begin mirroring all information on both mass storage systems 113 and 122 and resume normal operation of the system. If an operating system different than SFT-III does not provide this automatic update for consistency and mirroring, the implementation of the method will have to provide an equivalent service.

Note that when SFT-III is used, the only steps of the method that must be performed by the NETWARE loadable module are: (1) detecting the failure of server 120 (step 301), (2) setting communications means 241 to disconnect mass storage system 122 from computer 121 and connecting it to computer 111 (step 304), (3) determining if mass storage system 122 was the cause of the failure of server 120 (also part of step (304), and (4) commanding SFT-III to scan for mass storage systems so that it finds the newly-connected mass storage system 122 (step 305). All the other steps are performed as part of the standard facilities of SFT-III. In other embodiments of the invention, responsibility for performing the steps of the method may be allocated differently.

Figure 4:
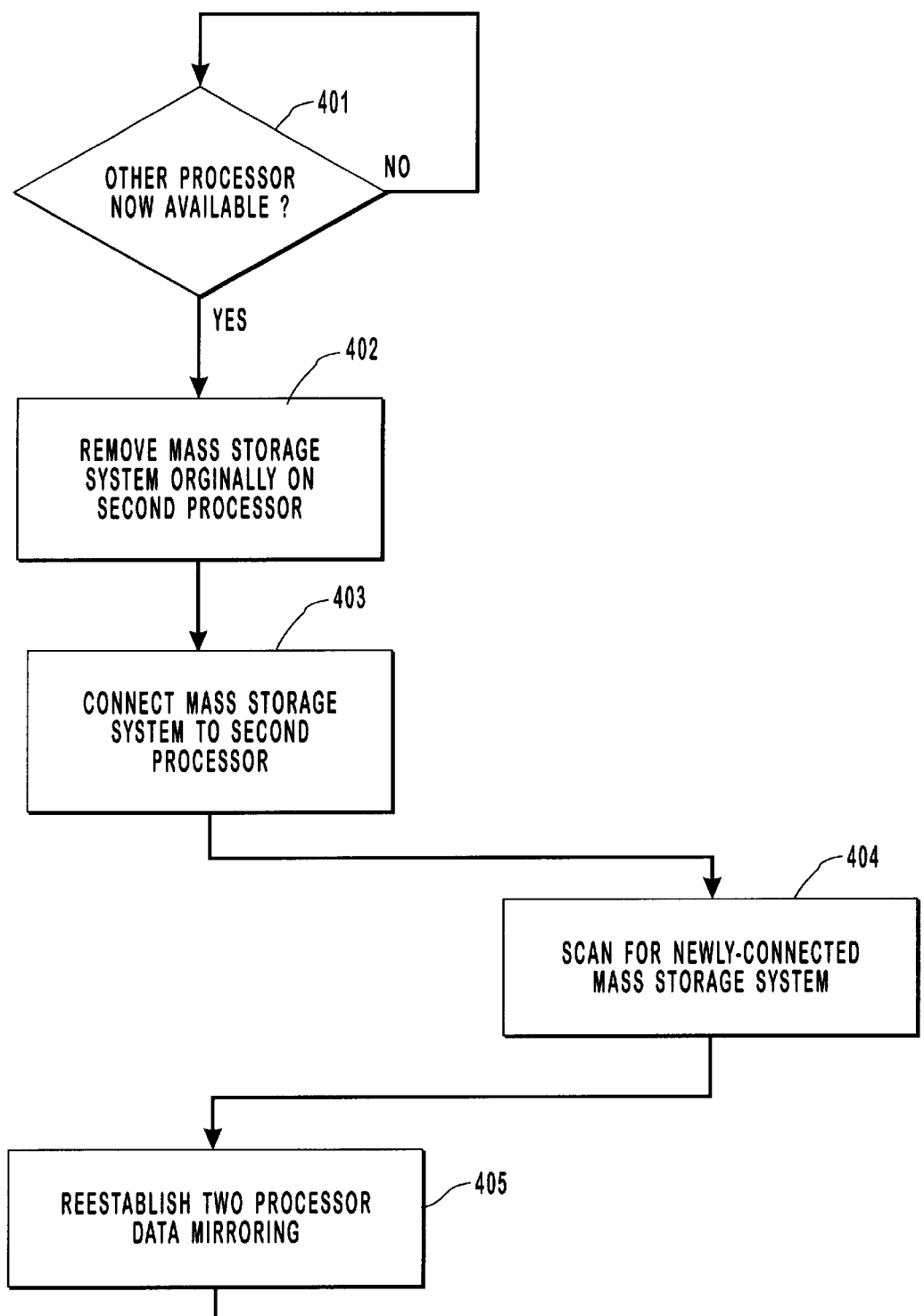
FIG. 4 is a flow diagram illustrating the steps which may be taken when the previously-failed processor becomes available.

FIG. 4 is a flow diagram illustrating the second portion of the invention—the steps to be taken when previously-failed server 120 becomes available again. Server 120 would typically become available after correction of the problem that caused its failure described above. Step 401 determines that server 102 is available and the method proceeds to step 402. In step 402, the method sets connection means 241 to disconnect mass storage system 122 from computer 111 after commanding SFT-III on server 110 to remove mass storage system 122 from its active mass storage systems. Due to the unavailability of mass storage system 122 on server 110, data mirroring on server 110 will be stopped by SFT-III and it will begin remembering changes to mass storage system 113 not made to mass storage system 122 to be used in making the storage systems consistent later.

In step 403, mass storage system 122 is reconnected to computer 121, and in step 404, SFT-III on server 120 is commanded to scan for the newly-connected mass storage system 122. This returns mass storage system 122 to the computer 121 to which it was originally connected prior to a server failure. When SFT-III on server 120 detects mass storage system 122, it communicates with server 110 over link 131. At this point, the operating systems on servers 110 and 120 work together to make mass storage system 122 again consistent with mass storage system 113 (i.e., by remembering interim changes to mass storage system 113 and writing them to mass storage system 122), and when consistency is achieved, data mirroring on the two servers resumes. At this point, recovery from the server failure is complete.

In an SFT-III system, the only steps of the method that the NetWare Loadable Module must perform are: (1) detecting the availability of server 120 (step 401), (2) removing mass storage system 122 from the operating system on server 110 (step 402), (3) disconnecting mass storage system 122 from computer 111 and connecting it to computer 121 by setting connection means 241 (step 403), and (4) commanding SFT-III on server 120 to scan for mass storage so that it locates mass storage system 122 (step 404). The steps involved with making mass storage systems 113 and 122 consistent and reestablishing data mirroring (step 405) are performed as part of the standard facilities of SFT-III. In other embodiments of the invention, responsibility for the steps of the method may be allocated differently.

FIG. 2 illustrates optional mass storage systems 112 and 123 attached to computers 111 and 121, respectively. While these two mass storage systems are not required by the method of the present invention, they are useful during the restoration of a failed server. They provide storage for the operating system and other information needed by failed server 120 to begin operation before mass storage system 122 is switched from computer 111 to computer 121. Were mass storage system 123 not available, some means of having mass storage system 122 connected both to computer 121 (for initializing its operation following correction of its failure) and computer 111 (for continued disk mirroring) would be necessary. Alternatively, if the initialization time of server 120 is short, mass storage system 122 could be switched from computer 111 to computer 121 at the start of server 120's initialization, though this would result in more changes that must be remembered and made before data mirroring can begin again.

Figure 5:
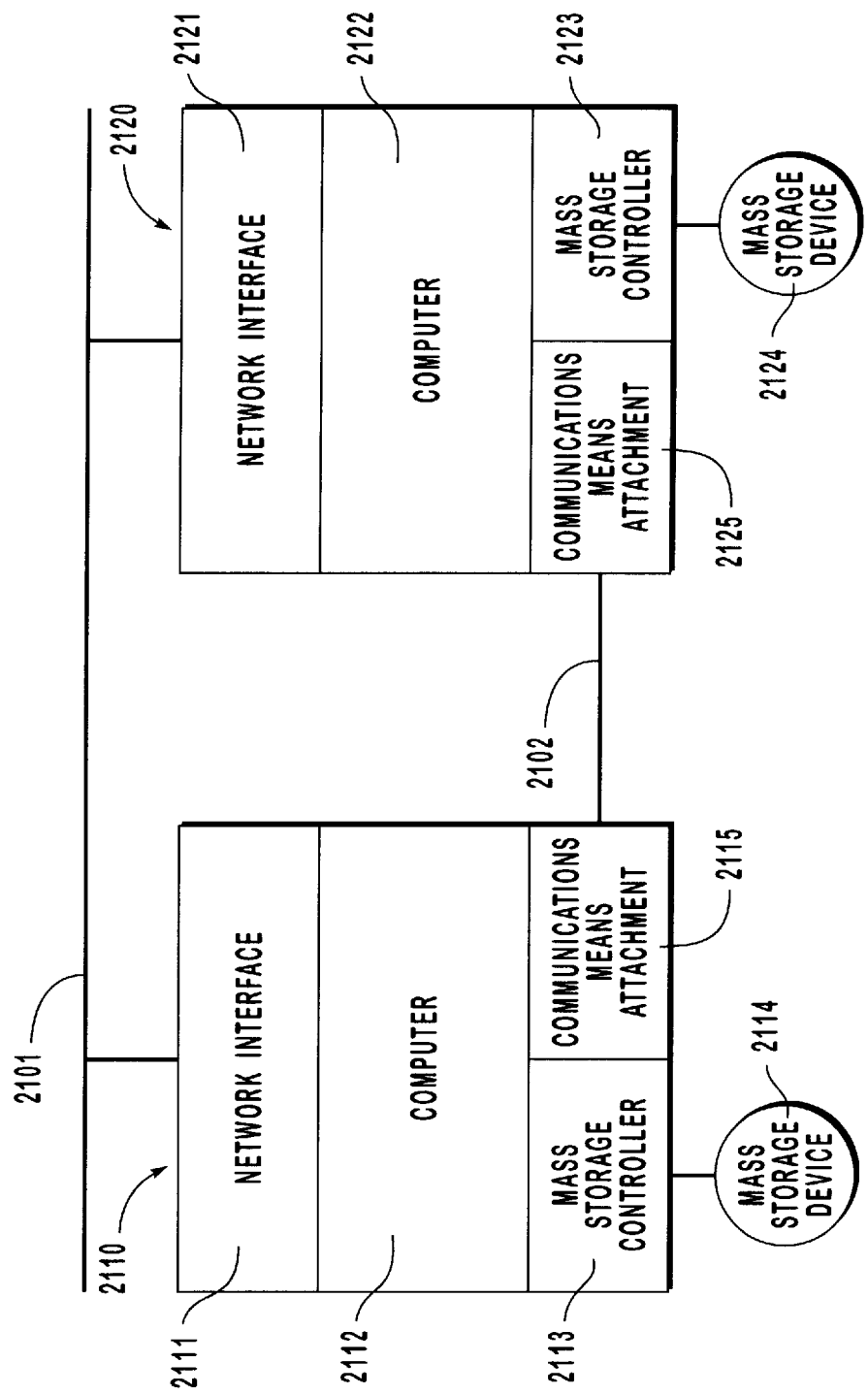
FIG. 5 illustrates a computer configuration on which one method of the invention runs.

Referring to FIG. 5, which illustrates a representative computer configuration on which the method of the invention runs, it can be seen that there are two computer systems 2110 and 2120. The first computer system 2110 is running a file server operating system (such as Novell NetWare®). Computer system 2110 includes computer 2112 connected to network 2101 through interface 2111 (and its associated software), and mass storage device 2114 connected through controller 2113 (and its associated software). These represent the standard components of a network file server. In the case of NetWare, computer 2112 may be a PC-compatible computer based on an Intel 486 or Pentium processor, network 2101 can be an ethernet (so that interface 2111 is an ethernet interface), and mass storage device 2114 can be a SCSI or IDE magnetic disk connected through an appropriate controller 2113. Computer 2122 would also be a PC-compatible computer, so that it could also run the same NetWare file server operating system as computer 2112. Network 2101 could also be implemented as a token ring, Arcnet, or any other network technology.

The mass storage devices of the invention should not be viewed as limited to magnetic disk drives, but can also be implemented using optical discs, magnetic tape drives, or any other medium capable of handling the read and write requests of the particular computer system.

Added to the standard network file server to support the method of this invention are a backup computer system 2120 and a means 2102 for communicating between computer system 110 and computer system 2120.

Computer system 2120 has components similar to computer system 2110. Computer system 2120 can be connected to network 2101 through interface 2121, although it is not necessary for computer system 2120 to actually be connected to network 2101 during normal operation. Computer 2122 is connected to interface 2121 and to mass storage device 2124 through controller 2123.

While it is not necessary for computer system 2120 to have identical components to computer system 2110, in many cases that will be the case. In other cases, computer system 2120 may be an older, slower system previously used as a file server but replaced with computer system 2110. All that is required of computer system 2120 is that it be capable of running the file server operating system in case of the failure of computer system 2110, and that its mass storage device 2124 be of sufficient capacity to hold the data mirrored from mass storage device 2114.

Communications means 2102 provides a link between computer systems 2110 and 2120. Computer 2112 is connected to communications means 2102 through attachment 2115, and computer 2122 is connected to communications means 2102 through attachment 2125. Communications means 2102 can be implemented using a variety of techniques, well-known to those skilled in the art. In the preferred embodiments, a high-speed serial point-to-point link is used. An alternative would be to use the serial communications ports of computers 2112 and 2122, programmed to run at a high data rate, or the parallel interfaces of computers 2112 and 2122. Another alternative is for communications means 2102 to be a virtual circuit or channel carried on network 2101. In this latter case, communications means 2102 would really be network 2101, attachment 2115 would really be interface 2111, and attachment 2125 would really be interface 2121.

It is important that communication means 2102 provide data transfer at rates comparable to the data rate of mass storage device 2124 so that it does not limit the performance of the system. The method of this invention is not dependant on the particular implementation of communications means 2102, although a communications means 2102 dedicated only to the method of this invention will generally result in more efficient operation and simpler programs.

Figure 6:
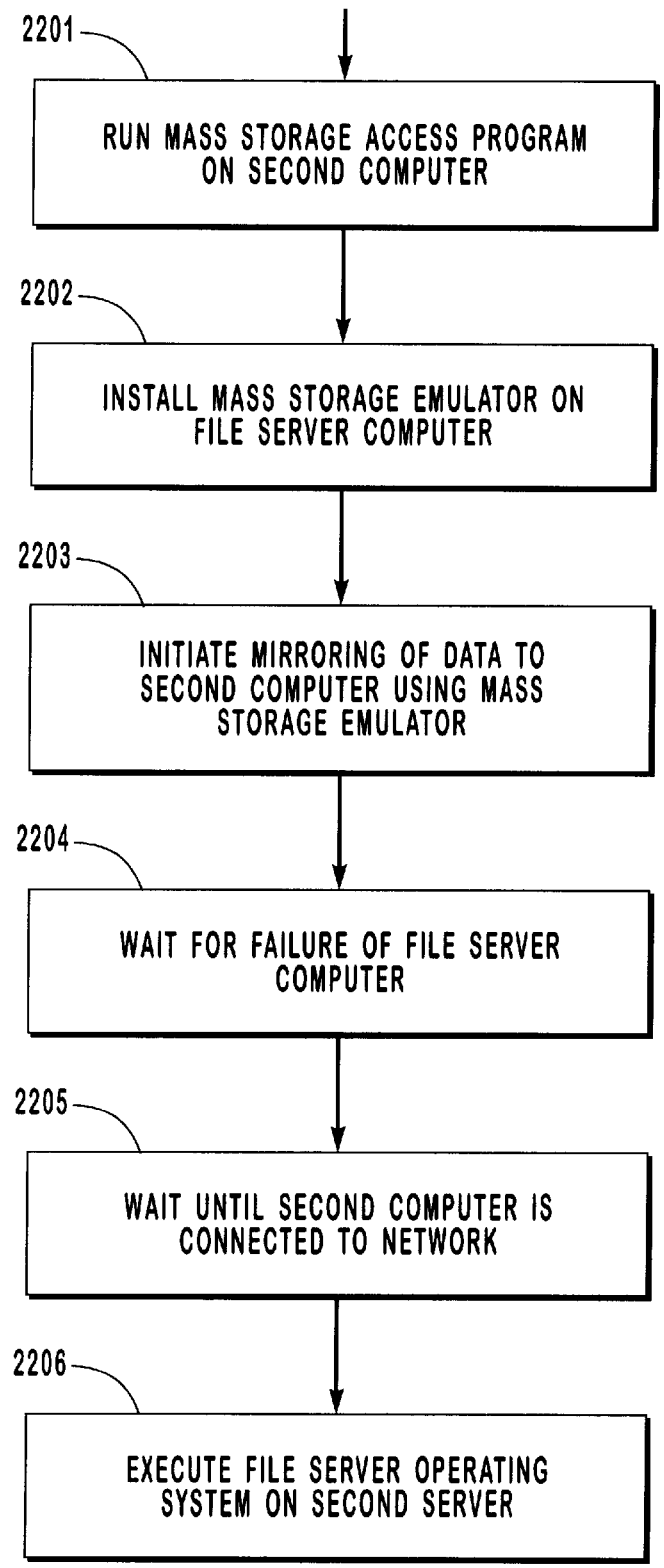
FIG. 6 is a flow diagram showing the steps of one preferred embodiment of the method of the invention.

FIG. 6 is a flow diagram showing the steps of the method of the invention. In step 2201, a special program, the mass storage access program, is run on computer system 2120. The mass storage access program receives commands from computer system 2110 over communications means 2102. Based on those commands, the mass storage access program accesses mass storage device 2124 to perform the operation specified in the command received from computer system 2110. The results of the accessing of mass storage device 2124 is returned to computer system 2110 over communications means 2102.

The mass storage access program can be enhanced to provide a cache of data on mass storage device 2124. The implementation of such a cache function is well-known in the art, consisting of keeping a copy of the most recently accessed information of mass storage device 2124 in the memory of computer 2122. When a read command is received, it is not necessary to access mass storage device 2124 if a copy of the data is in the cache. Since computer 2122 has a large memory (it must be large enough to run the file server operating system) and the mass storage access program is quite small, there is a large amount of memory available for the cache, particularly if computer 2122 is only running the mass storage access program. This means that many entries will be in the cache, and the chance of finding a block being read in the cache is higher than would be normal for a similar cache in a file server operating system.

In step 2202, coincidentally with the running of the mass storage access program on computer system 2120, another program, the mass storage emulator, is installed on computer system 2110. The mass storage emulator takes mass storage requests from the file server operating system running on computer system 2110 and sends them as commands over communications means 2102 to computer system 2120, where they are processed by the mass storage access program, as discussed above.

When results from a command are received from the mass storage access program over communications means 2102 by the mass storage emulator, they are returned to the file server operating system, much as the result of a normal mass storage request would be returned. In this way, the mass storage access program and the mass storage emulator cooperate to make it appear to the file server operating system that mass storage device 2124 is directly connected to computer 2112 on computer system 2110.

In most cases, the results returned from a read operation will be the data stored at the specified mass storage location. However, in some embodiments of the invention it will be desirable to return an alternative value for special mass storage locations. For example, the first block on many mass storage systems contains information such as volume names. It may be necessary to avoid duplicate volume names, so alternative data for the first block, containing a non-duplicate volume name, will be returned by the mass storage access program for a read of the first block.

The alternative data could be stored as part of the mass storage access program, stored in a special location on the mass storage device accessed by the mass storage access program, or stored on another mass storage device. It can also be generated by the mass storage access program from the data stored in the special location, such as modifying a particular field. In any case, when one of the special locations is read, the mass storage access program transfers the alternative data to the mass storage emulator.

In one embodiment of this invention, the mass storage access program is a conventional program running under the disk operating system of personal computer 2122. The disk storage emulator is a NetWare Loadable Module (NLM), much like the device driver for a disk drive. Copies of the source code for the mass storage access program and the mass storage emulator are given in the microfiche appendix.

In another embodiment of this invention, both computer systems 2110 and 2120 are running copies of the file server operating system. Computer system 2120 can function as a file server while acting as a backup for computer system 2110. The mass storage access program running on computer system 2120 can be either a regular user program or a NetWare Loadable Module.

The function described here with reference to FIGS. 5 and 6 is referred to by the inventors as a "standby" function.

Figure 7:
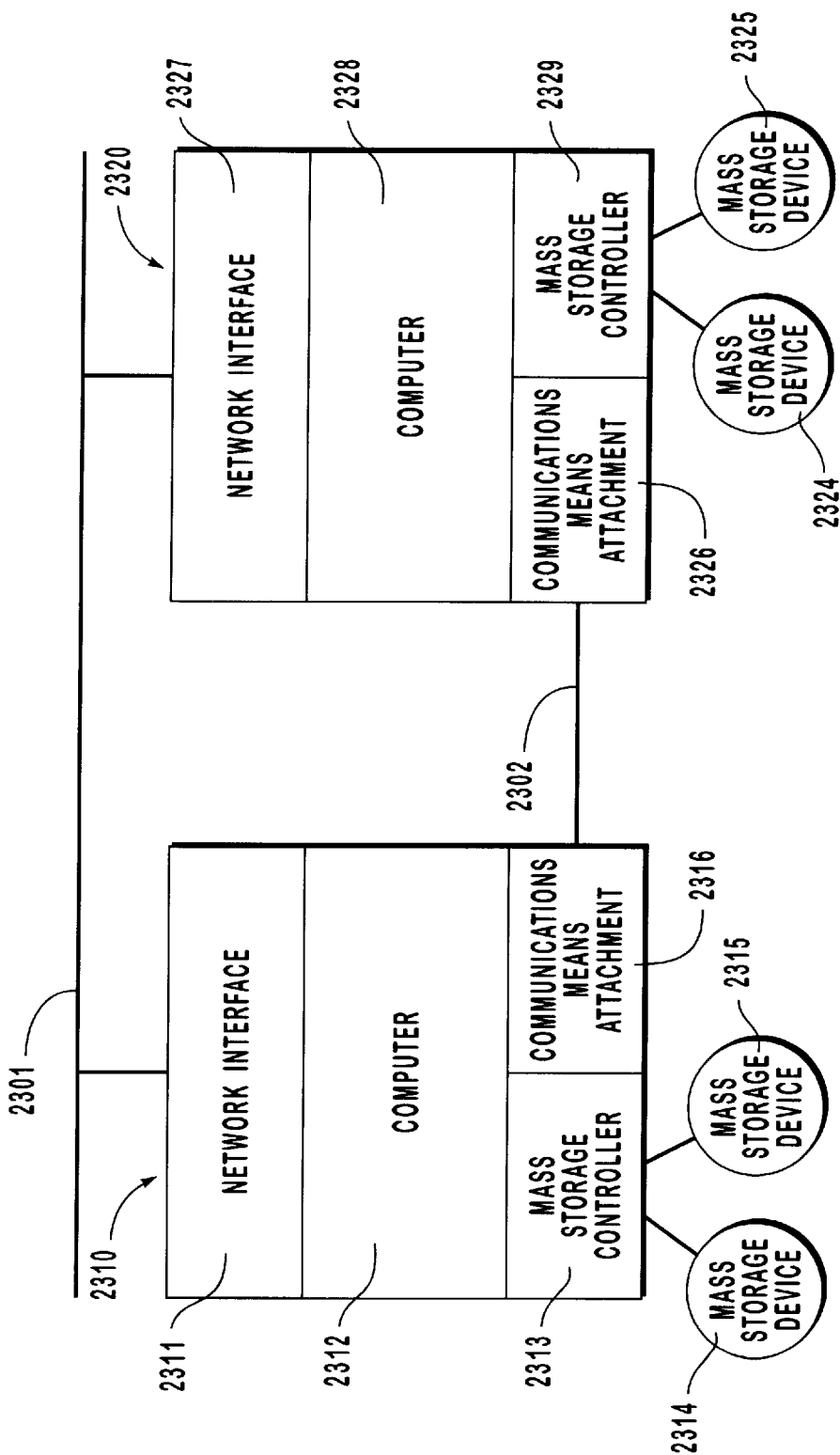
FIG. 7 illustrates a computer configuration with two file server computers.

In yet another embodiment of this invention, illustrated in FIG. 7, both computer systems 2310 and 2320 are running copies of the file server operating system, and each is acting as a backup for the other. This is referred to by the inventors as a "co-standby" function. Computer system 2310 is running a mass storage emulator allowing it to access mass storage device 2324 on computer system 2320 by communicating with the mass storage access program running on computer system 2320. Likewise, computer system 2320 including computer 2328 and network interface 2327 is running a mass storage emulator 2329 allowing it to access mass storage device 2314 on computer system 2310 by communicating with the mass storage access program running on computer system 2310. Each file server is acting as a backup for the other using the present invention. Thus, if either file server goes down, the other can continue to serve the needs of the computer network without down time. And when neither file server is down, the users enjoy the benefits of fully utilizing the resources of their redundant file server capability. This is advantageous in comparison to utilizing a single dedicated backup file server which provides no services for users until the primary file server becomes unavailable.

If both computer systems 2310 and 2320 are running the file server operating system, there may be difficulties if the file server operating system uses special names in the labels of the disks. As illustrated in FIG. 7, file server 2310 has mass storage devices 2314 and 2315, and file server 2320 has mass storage devices 2324 and 2325. Mass storage devices 2314 and 2324 are the normal system disks on computer systems 310 and 320, respectively, and mass storage devices 2315 and 2325 are used to backup the other file server.

Often, an operating system such as NetWare will use a special disk label such as SYS for its main system disk. In the system of FIG. 7, mass storage devices 2314 and 2324, the normal system disks, will have the label SYS. However, because mass storage device 2325 is a mirror of mass storage device 2314, mass storage device 2325 would normally also have the label SYS. Similarly, mass storage device 2315, the mirror of mass storage device 2324, would also have the label SYS. With many operating systems, such duplicate labels would cause difficulties.

This problem can be overcome by altering the mass storage access programs running on computer systems 2310 and 2320 to return alternative data when a read operation is performed on certain mass storage locations. To handle the duplicate label problem, each mass storage access program is configured to return an alternative label whenever the mass storage location containing the label is read.

For example, mass storage device 2315 might have a real label of SYS.LEE (indicating that it is a mirror copy of the SYS disk of file server LEE) but the mass storage access program on computer system 2310 would be programmed to return a label of SYS to the mass storage emulator running on computer system 2320 whenever the label location is read. This would mean that computer system 2310 would see disks with different labels (SYS for mass storage device 2314 and SYS.LEE for mass storage device 2315). However, computer system 2320 would see the label SYS on both mass storage device 2324 and on mass storage device 2315, the mirror for mass storage device 2324. Similarly, the real label for mass storage device 2325 might be SYS.DAN (mirror copy of disk SYS on server DAN) but a label of SYS would be seen by computer system 2310.

Returning to FIG. 6, in step 2203, mirroring of data is initiated. When data is being mirrored on two or more mass storage devices, whenever data is to be written it is written to all mass storage devices taking part in the mirroring, at the same location on each mass storage device. (The location may be relative to the start of the mass storage device, or to the start of a partition or contiguous portion of the mass storage device, as appropriate to the way the mass storage device has been formatted and is being used.) Data can be read from any mass storage device taking part in the mirroring, since each mass storage device contains identical data.

Mirroring may be an integral function of the file server operating system, so that no special program is necessary for implementing disk mirroring as part of the method of this invention. Step 2203 only requires the activation or starting of mirroring on the part of the file server operating system. This is the case in the preferred embodiments of the invention, operating with NetWare and using the mirroring facilities of that file server operating system.

If the file server operating system does not provide mirroring, a separate mirroring module will have to be implemented. Such a mirroring module, whose implementation should be obvious to one skilled in the art, will take each write request and pass it to the driver for each mass storage device taking part in the mirroring. For mass storage device 2124 on computer system 2120, the driver will be the mass storage emulator, discussed above. When successful completion of the write request has been received from all mass storage devices taking part in the mirroring, the mirroring module will indicate successful completion to the file server operating system.

For read requests, the mirroring module can direct the read request to any of the mass storage devices, since all contain identical data. Generally, the read request will be directed to the mass storage device which is first available to handle the request.

As part of the initiating of mirroring, it is necessary to assure that each mass storage device taking part in mirroring has the same contents at the start of mirroring. This can be done by designating one of the mass storage devices as the master, and making a copy of the master mass storage device's data to all other mass storage devices taking part in the mirroring. An alternative approach is to have a timestamp indicating when the last change was made to the data on a mass storage device. If the timestamp on a mass storage device is the same as the timestamp on the master mass storage device, it will not be necessary to make a new copy of the data.

At step 2204, the method of this invention waits until a failure of file server computer system 2110 is detected. Such a failure could come from the failure of either hardware (such as computer 2112 or mass storage device 2114) or software (such as the file server operating system). Although means for automatically detecting such a failure may be used, such failure can also be detected by a system operator or workstation user noticing that file server requests are no longer being handled by computer system 2110. It is not difficult for a user to determine there is a problem with file server computer system 2110; in most cases, a user workstation will stop working and "hang" while it waits for a file server request that will never be honored.

In step 2205, when a failure of computer system 2110 has been detected, if computer system 2120 is not currently connected to network 2101 through interface 2121, it is connected to network 2121. This can be done either by activating interface 2121 or physically connecting interface 2121 to network 2101, as appropriate.

In step 2206, when computer system 2120 has been connected to network 2101, the file server operating system is loaded into computer 2122 and executed if computer 2122 is not already running the file server operating system, so that computer system 2120 is a file server computer system. New file server computer system 2120 now responds to requests received from network 2101 as failed file server computer system 2110 did before its failure. The file server operating system executing on computer 2122 accesses mass storage device 2124 to respond to the requests.

Note that because mass storage device 2124 received data through the mass storage emulator and mass storage access program while file server computer system 2110 was operating, mass storage device 2124 contains a copy of the data stored on mass storage device 2114 prior to the failure of computer system 2120. (Because of timing, the last few write operations may not have occurred on all mass storage devices taking part in mirroring, but the file server operating system is capable of handling these small differences.) Because a copy of the mass storage data of failed file server computer system 2110 is immediately available to new file server computer system 2120, the time necessary to recover from a file server failure is minimal.

When the fault that caused the failure of computer system 2120 has been corrected, fault-tolerant operation can be restored. Depending on the relative capabilities of computer systems 2110 and 2120, one of two techniques can be employed. Both involve the same method steps as were discussed above.

If the two computer systems have components of similar speed and capacity, there is no reason not to continue using computer system 2120 as the file server computer. In this case, computer system 2110 can now be treated as the backup computer system. The mass storage access program is run on computer system 2110, the mass storage emulator is installed on computer system 2120, and mirroring is initiated on the file server operating system running on computer system 2120. As part of the initiating of mirroring, any data written to mass storage device 2124 during the time computer system 2110 was not available is now copied to mass storage device 2114 though the mass storage emulator, communications mean 2102, and the mass storage access program.

Alternatively, if computer system 2120 is less capable than computer system 2110, it will be desirable to make computer system 2110 the file server computer system when the failure has been corrected. To accomplish this, two approaches are possible. In the first approach, computer system 2110 is brought up as the backup computer system, running the mass storage access program, as discussed above. When mass storage device 2114 contains a copy of the data on mass storage device 2124, computer system 2110 can be restarted as the file server (running the file server operating system) and computer system 2120 can be restarted as the backup computer in accordance with the method discussed above.

The second approach is when the failure of computer system 110 has been corrected, computer system 2120 is restarted as backup computer system, running the mass storage access program, and computer system 2110 is restarted as the file server computer, running the file server operating system and the mass storage emulator. When mirroring is initiated, it will be determined by the timestamps stored on each of mass storage devices 2114 and 2124 that the data on mass storage device 2114 is out of date. The file server operating system will read the data on mass storage device 2124 (though the mass storage emulator, communications means 2102, and the mass storage access program). It will also copy the data from mass storage device 2124 to mass storage device 2114 until they contain identical data.

Figure 8:
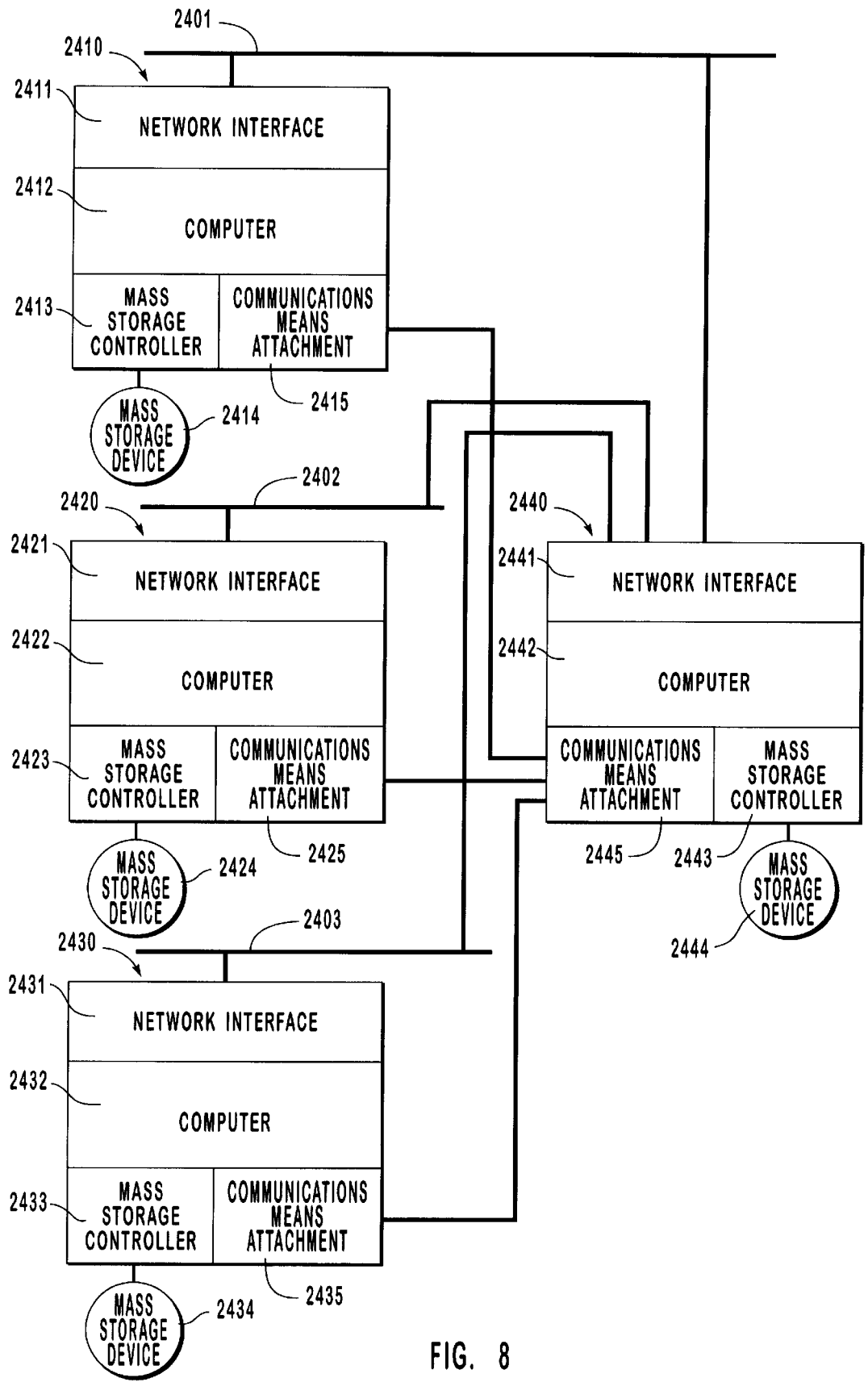
FIG. 8 illustrates a single backup computer supporting a plurality of file server computers.

It is possible for a single computer system to act as the backup for a plurality of file server computers, not just a single file server as was discussed above. FIG. 8 illustrates one possible configuration. It shows three file server computer systems 2410, 2420, and 2430 serving networks 2401, 2402, and 2403, respectively. They can communicate with backup computer system 2440 through communications means attachments 2415, 2425, 2435, and 2445. Communications means attachments 2445 can be a single device, or three identical devices interfaced to computer 2442. Computer 2442 can also be attached to networks 2401, 2402, or 2403 through network interfaces 2441. Network interfaces 2441 could be a single device switchable to networks 2401, 2402, or 2403, as required, a single device capable of connecting to three networks, or three separate devices.

Each file server computer 2410, 2420, and 2430 runs a mass storage emulator as previously described. Backup computer 2440 can run either a single mass storage access program capable of communicating with a plurality of mass storage emulators. Alternatively, if the operating system on the backup computer permits the running of multiple processes, the backup computer can run a separate mass storage access program for each mass storage emulator. Backup data is stored on mass storage devices 2444, which must have a total capacity equal to the sum of the capacities of mass storage devices 2414, 2424, and 2434 which are being mirrored. Mass storage device 2444 can be implemented as a single, large storage device or a plurality of smaller storage devices.

When a failure of one of file server computers 2410, 2420, or 2430 is detected, backup computer 2440 takes on the role of the failed file server as described above. While acting as a file server, backup computer 2440 can continue to act as a backup for the remaining file servers by continuing to run a mass storage access program.

Computer programs implementing the mass storage emulator and the mass storage access program will commonly be distributed to users on a computer-readable medium such as floppy disk or CD-ROM. From there, they will often be copied to a hard disk or a similar intermediate storage medium. When the mass storage emulators or mass storage access programs are to be run, they will be loaded either from their distribution medium or their intermediate storage medium into the execution memory of the computer, configuring the computer to act as a mass storage emulator or mass storage access program.

Figure 9:
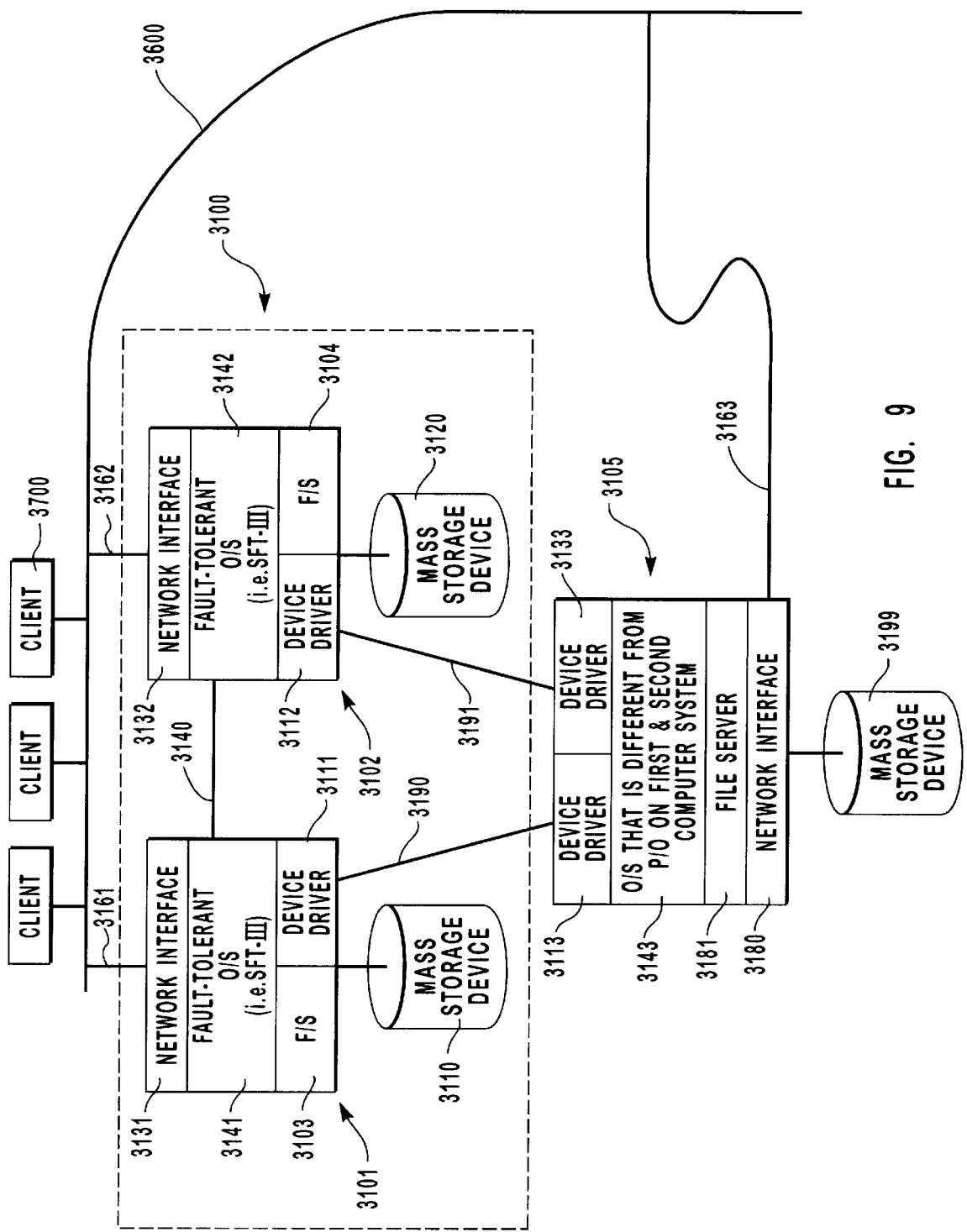
FIG. 9 depicts a file server computer system acting in standby or co-standby mode for a fault-tolerant computer system.

Referring now to FIG. 9, a depiction of a preferred method and system for improving recovery performance from both hardware and software errors in a fault-tolerant computer system are shown. The diagram of FIG. 9 shows a file server computer system acting in standby or co-standby mode for a fault-tolerant computer system. The figure shows a standard fault tolerant computer system 3100 which may simply be a fault-tolerant computer system of the prior art. For example, a Novell SFT-III pair of file servers could be used as depicted in FIG. 1 and as described in the text above. An appropriate fault-tolerant computer system may include a first computer system 3101 having a network interface 3131 so that it can communicate across a communication channel 3161 with a computer network 3600 having a plurality of clients 3700. The first computer system 3101 will have a fault-tolerant operating system 3141, such as Novell's SFT-III, running on a file server computer 3103. The first computer system 3101 will have a communication channel 3140 with a second computer system 3102 that has a network interface 3132 for communicating over a communications channel 3162 to the network 3600. The second computer system 3102 has a file server 3104 running the same fault-tolerant operating system 3142 as the first computer system 3101. Each of the first and second computer systems 3101 and 3102 respectively, has a mass storage device, 3110 and 3120 respectively.

Also connected to the computer network 3600 over a communications channel 3163 is a third computer system 3105. The third computer system 3163 includes a file server computer 3181 having an appropriate network interface 3180 and running an operating system 3143 that is different from the operating systems 3141 and 3142 of the fist and second computer systems 3101 and 3102. The third computer system 3105 has a device driver 3113 and communications channel 3190 enabling it to communicate with a device driver 3111 of the first computer system 3101. The third computer system 3105 also has a device driver 3133 and communications channel 3191 enabling it to communicate with a device driver 3112 of the second computer system 3102.

When the system of FIG. 9 is running, the memory of computer 3103 will be mirrored over the communication channel 3140 to the memory of computer 3104, and the entire contents of mass storage device 3110 belonging to the fist computer system 3101 are mirrored on mass storage device 3120 of the second computer system 3102. The entire fault-tolerant computer system 3100 is seen by the users as a single file server serving the network 3600. In case of a fault by the first computer system 3101, the second computer system 3102 can serve the network users as described in conjunction with FIG. 1 above and as described in U.S. Pat. No. 5,157,663 to Major et al., which is hereby incorporated by reference in its entirety. Alternatively, another type of fault-tolerant computer system 3100 could be used without departing from the scope and intent of the inventive concept.

Through use it has been found that when an operating system 3141 error causes the file server 3101 to go down, the same error will occur in operating system 3142, causing file server 3142 to go down. In such an instance, the users of the network 3600 are left without a file server and the redundancy of the fault-tolerant computer system 3100 has not benefited them.

The invention includes a third computer system 3105 having a file server computer 3181 that includes a network interface 3180 for communicating with the computer network 3600 over a communications channel 3163. The file server computer 3181 has a mass storage device 3199 on which it may store information. Importantly, file server 3181 of the third computer system 3105 is running an operating system 3143 that is a separate and different operating system from the operating systems 3141 and 3142 of the first and second computer system. A separate and different operating system is chosen as the operating system 3143 of the third computer system 3105 so that if an operating system software error causes unavailability of the first computer system 3101 and second computer system 3102, the operating system 3143 of the third computer system 3105 will not experience the same fault and therefore will continue to serve clients 3700 on the network 3600.

Depending upon the operating system 3143 chosen for the third computer system 3105, the third computer system 3105 could serve as a slave to the fault-tolerant computer system 3100 (much as the second computer system 3102 serves as a slave to the first computer system 3101 in the Novell SFT-III environment). Alternatively, the third computer system 3105 could be arranged to serve in a standby or co-standby capacity, as those capacities are described with reference to 5–8 above.

The mass storage device 3199 is presented to the fault-tolerant computer system 3100 as an additional storage device which may be accessed through device drivers 3111 and 3112 on the first computer system 3101 and second computer system 3102 which communicate with device drivers 3113 and 3133 on the third computer system 3105.

It is known that either the first computer system 3101 or the second computer system 3102 may serve as the primary file server computer system in the fault-tolerant computer system 3100. The device drivers 3113 and 3133 of the third computer system 3105 will facilitate communication with the primary file server of the fault-tolerant computer system 3100. Device driver 3113 is responsible for such communication when the first computer system 3101 is acting as the primary server, and device driver 3133 is responsible for such communication when the second computer system 3102 is acting as the primary server. The responsible device driver 3113 or 3133 will mirror the memory and mass storage (3110 or 3120) to the file server 3181 and mass storage device 3199 of the third computer system.

The third computer system 3105 will always know which computer system 3101 or 3102 is acting as the primary server by observing which device driver 3113 or 3133 is communicating with the fault-tolerant computer system 3100 in order to perform the mirroring operation. Whenever there is a complete failure of the fault-tolerant computer system 3100, the third computer system 3105 will automatically take over as the primary server in order to provide service to network clients 3700. Before a complete failure of the fault-tolerant computer system 3100, the third computer system 3105 can serve as an additional file server on the network 3600 if it is implemented according to the standby server technology of the invention. If there is a failure of only one of the file servers 3103 or 3104 of the fault-tolerant computer system 3100, then the device drivers 3113 and 3133 of the third computer system 3105 will continue to manage mirroring in case of a later catastrophic failure of the entire fault-tolerant computer system 3100. Only by implementing a system such as this with a third computer system 3105 running a separate and different operating system 3143 from that of the fault-tolerant computer system 3100, and communicating with the fault-tolerant computer system 3100 file servers 3103 and 3104 through device drivers 3113 and 3133, can a truly fault-tolerant system be implemented in an environment using or similar to Novell's SFT-III.

Figure 10:
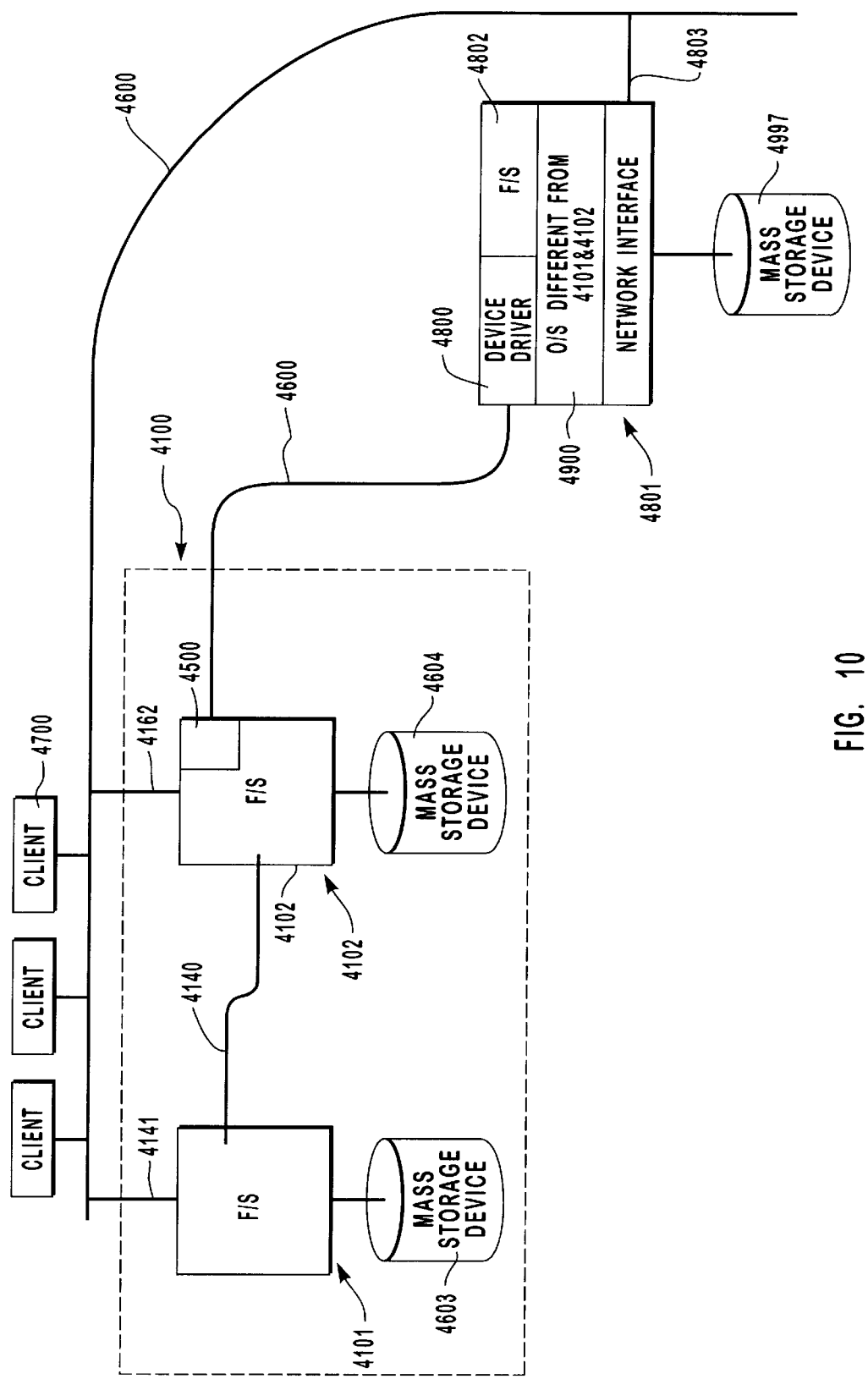
FIG. 10 depicts an alternative embodiment of a file server standing by for a fault-tolerant computer system.

FIG. 10 shows an alternative embodiment of the inventive concept of FIG. 9. In FIG. 10, a fault-tolerant computer system 4100 having a pair of file server computer systems 4101 and 4102, each having a mass storage device 4103 and 4104 respectively, and each having a communication channel 4141 and 4162 with the network 4600. The first computer system 4101 and the second computer system 4102 communicate with each other through communication channel 4140. The fault-tolerant computer system 4100 may be any type of fault-tolerant computer system, such as Novell's SFT-III, Vinca Corporation's StandbyServer, Vinca Corporation's Co-StandbyServer, or Vinca Corporation's Safety Lines products.

The second computer system 4102 of the fault-tolerant computer system 4100 has a device driver 4500 which communicates over a communication channel 4600 with a device driver 4800 of a third computer system 4801. The third computer system 4801 includes a file server 4802 and an operating system 4900 that is separate and different from the operating systems 4101 and 4102 of the fault-tolerant computer system 4100. The third computer system 4801 also includes a network interface 4804 for communicating over communication channel 4803 with the network 4600.

The device driver 4800 of the third computer system 4801 monitors the device driver 4500 of the second computer system 4102 to determine of the second computer system 4102 is unavailable. When the second computer system 4102 is unavailable, presumably both the primary file server has first gone down, the backup file server has taken over and gone down, and then the third computer system 4801 can immediately take over as the primary file server. The third computer system 4801 is able to do this because the third computer system 4801 has a mass storage device 4997 which contains a mirror copy of the data from the first and second computer systems 4101 and 4102. Because the third computer system 4801 takes over as soon as it notices that the second computer system 4102 is unavailable, the clients 4700 experience uninterrupted access to the network 4600.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

SOURCE CODE

The computer source code list below illustrates one preferred embodiment of the invention.

We claim:

1. A method for rapid recovery from a network file server failure, operating on a computer configuration comprising:
    a plurality of computer systems adapted for responding to file server requests, each of said plurality of computer systems comprising:
        a computer executing a file server operating system, and a mass storage device connected to said computer;
    an additional computer system, comprising:
        an additional computer which can execute said file server operating system, and
        an additional mass storage system comprising at least one mass storage device, connected to said additional computer;
    and means for communicating between each of said plurality of computer system and said additional computer system,
    the recovery method comprising:
        running a mass storage access program on said additional computer, said mass storage access program receiving mirroring data from each computer of said plurality of computer systems over said communicating means and writing said mirroring data to said additional mass storage system;
    and for each computer system in said plurality of computer systems:
        installing a mass storage emulator on said computer system for use by said file server operating system, said mass storage emulator taking mass storage write requests from said file server operating system and sending mirroring data indicative of said write request to said additional computer system over said communicating means;
        initiating mirroring of data by writing said data both to said mass storage device of said computer system and through said mass storage emulator and said mass storage access program to said additional mass storage system, where said mass storage access program and said mass storage emulator makes a portion of said additional mass storage system appear as if said portion of said additional mass storage device were an extra mass storage device connected to said computer of said computer system in the same manner as said mass storage device is connected to said computer of said computer system;
        and then when a failure of any of said plurality of computer systems is detected, performing at least the following steps:

transferring responsibility for responding to file server requests previously responded to by said failed computer system to said additional computer system; and continuing to mirror data from said plurality of computer systems that have not failed to said additional computer system so that said additional computer system both responds to file server requests and mirrors data.

2. A method for recovery from failure of a network server in a network configuration comprising a plurality of network servers and a backup network server, said plurality of network servers being interconnected to said backup network server by means for communicating between said plurality of network servers and said backup network server, each of said plurality of network servers and said backup network server being adapted to execute a file serving operating system in order to process file server requests and each of said plurality of network servers and said backup network server comprising at least one attached mass storage device, said method comprising the steps of:

initiating operation of said file serving operating system on said plurality of network servers so that each of said plurality of network servers becomes operative to process file server requests;

selecting at least one of a first and second system configuration, wherein the first system configuration permits said backup network server to operate solely as a backup to said plurality of network servers, whereby file server requests are not processed by said backup network server until a failure of one of said plurality of network servers occurs, and wherein said second system configuration permits said backup network server to process different file server requests from any of said plurality of network servers both prior to and after occurrence of a failure of one of said network servers; and initiating data mirroring from said each of said plurality of network servers to said backup network server via said means for communicating so that when a data write request is received by any of said plurality of network servers, data contained in said write request is written both to the at least one mass storage device attached to the network server which received the write request and to the at least one mass storage device attached to said backup network server.

3. A method for recovery from failure of a network server as recited in claim 2 wherein said initiating data mirroring step is accomplished by performing at least the steps of:

executing on each of said plurality of network servers a mass storage emulator program means for emulating a mass storage device so that each of said plurality of network servers appears to have at least one extra mass storage device in addition to the at least one mass storage device attached to each of said plurality of network servers; and executing on said backup network server at least one mass storage access program means for communicating with said mass storage emulation program on each of said plurality of network servers over said means for communicating and for writing data received over said means for communicating to the at least one mass storage device attached to said backup network server so that when data is written to said mass storage emulation program on one of said plurality of network servers, the data is transferred from said mass storage emulation program on said one of said plurality of network servers to said backup network server and written to the at least one mass storage device attached thereto.

4. A method for recovery from failure of a network server as recited in claim 3 wherein said mass storage access program is adapted to return data to said mass storage emulation program in response to a read command and said mass storage access program comprises a cache of data so that when said mass storage access program receives, from any of said plurality of network servers via said means for communication, a read command comprising a request for data, the requested data is retrieved from said cache if the requested data resides therein and from the at least one mass storage device attached to said backup network server if the requested data does not reside in said cache.

5. A method for recovery from failure of a network server as recited in claim 2 wherein said backup network server is configured to process different file server requests from any of said plurality of network servers and said method further comprises the step of initiating data mirroring from said backup network server to at least one of said plurality of network servers via said means for communicating so that when a data write request is received by said backup network server, data contained in said write request is written both to the at least one mass storage device attached to said backup network server and to the at least one mass storage device attached to said at least one of said plurality of network servers.

6. A method for recovery from failure of a network server as recited in claim 5 further comprising the steps of:

detecting failure of any one of said plurality of network servers or said backup network server; and if any one of said plurality of network servers has failed then transferring responsibility for processing file server requests that were previously processed by said failed network server to said backup network server and exiting the method; and if said backup network server has failed, then transferring responsibility for processing file server requests that were previously processed by said backup network server to said at least one of said plurality of network servers and exiting the method.

7. A method for recovery from failure of a network server as recited in claim 2 further comprising the steps of:

detecting failure of any of said plurality of network servers; and transferring responsibility for processing file server requests that were previously processed by said failed network server to said backup network server so that said network configuration continues to operate and does not fail even though one of said plurality of network servers has failed.

8. A method for recovery from failure of a network server as recited in claim 2 wherein if a read request is received by one of said plurality of network servers, the read request is filled by said one of said plurality of network servers by performing at least the following steps:

initiating at least one read command to retrieve data both from the at least one mass storage device attached to said one of said plurality of network servers and from the at least one mass storage device attached to said backup network server;

waiting for the first response to said at least one read command from one of either the at least one mass storage device attached to said one of said plurality of network servers or the at least one mass storage device attached to said backup network server; and returning the retrieved data as the result of the received read request.

9. A method for recovery from failure of a network server as recited in claim 8 wherein if the at least one read command specifies data is to be read from at least one special mass storage location, then when the backup network server receives the at least one read command, the backup network server returns alternative data in response to said at least one read command and not the data stored in said at least one special mass storage location.

10. A method for recovery from failure of a network server as recited in claim 2 wherein said plurality of network servers comprise two network servers that each execute the same file server operating system and that individually process each received file server request in parallel so as to execute the same instructions thereby providing a fault tolerant computer system.

11. A method for recovery from a file server failure in a network configuration comprising a plurality of network servers and a backup network server interconnected by means for communicating between said plurality of network servers and said backup network server, each of said plurality of network servers and said backup network server comprising a file serving operating system and at least one mass storage device connected thereto, said method comprising the steps of:

selecting a network configuration wherein said plurality of network servers and said backup network server become operative to process different file server requests so that a given file server request is processed either by said backup network server or by at least one of said plurality of network servers; and initiating data mirroring from said plurality of network servers to said backup network server via said means for communicating so that when a data write request is received by one of said plurality of network servers, data contained in said write request is written both to the at least one mass storage device of said one of said plurality of network servers and to the at least one mass storage device of said backup network server by performing at least the following steps:

executing on each of said plurality of network servers a mass storage emulator program means for emulating a mass storage device so that each of said plurality of network servers appears to have at least one extra mass storage device in addition to the at least one mass storage device connected to each of said plurality of network servers; and executing on said backup network server at least one mass storage access program means for communicating with said mass storage emulation program on each of said plurality of network servers over said means for communicating and for writing data received over said means for communicating to the at least one mass storage device connected to said backup network server so that when data is written to said mass storage emulation program on any of said plurality of network servers, the data is transferred from said mass storage emulation program on said plurality of network servers to said backup network server and written to the at least one mass storage device connected thereto.

12. A method for recovery from failure of a network server as recited in claim 11 wherein said at least one mass storage access program is further adapted to return data to said mass storage emulation program in response to a read command and said mass storage access program comprises a cache of data so that when said mass storage access program receives, from one of said plurality of network servers via said means for communication, a read command comprising a request for data, the requested data is retrieved from said cache if the requested data resides therein and from the at least one mass storage device attached to said backup network server if the requested data does not reside in said cache.

13. A method for recovery from failure of a network server as recited in claim 12 wherein the method further comprises the step of initiating data mirroring from said backup network server to at least one of said plurality of network servers via said means for communicating so that when a data write request is received by said backup network server, data contained in said write request is written both to the at least one mass storage device connected to said backup network server and to the at least one mass storage device connected to said at least one of said plurality of network servers.

14. A method for recovery from failure of a network server as recited in claim 13 further comprising the steps of:

detecting the failure of either one of said plurality of network servers or the backup network server; and if one of said plurality of network servers has failed, then transferring responsibility for processing file server requests that were previously processed by said one of said plurality of network servers to said backup network server and exiting the method; and if said backup network server has failed, then transferring responsibility for processing file server requests that were previously processed by said backup network server to said at least one of said plurality of network servers and exiting the method.

15. A method for recovery from failure of a network server as recited in claim 12 wherein said plurality of network servers comprise two network servers that each execute the same file server operating system and that individually process each received file server request in parallel so as to execute the same instructions thereby providing a fault tolerant computer system.

16. A method for recovery from failure of a network server as recited in claim 12 wherein said plurality of network servers comprise a first network server and a second network server interconnected by means for communicating between said first network server and said second network server, said second network server operating as a backup to said first network server so that if said first network server fails, said second network server assumes responsibility for processing the file server requests previously processed by said first network server, and wherein said backup network server is connected to said second network server by means for communicating between said second network server and said backup network server, said backup network server operating as a backup to said second network server so that said if said second network server fails, said backup network server assumes responsibility for processing file server requests previously processed by said second network server.

17. A method for recovery from failure of a network, server in a network configuration comprising a plurality of network servers and a backup network server, said plurality of network servers being interconnected to said backup network server by means for communicating between said plurality of network servers and said backup network server, each of said plurality of network servers and said backup network server being adapted to execute a file serving operating system in order to process file server requests and each of said plurality of network servers and said backup network server comprising at least one attached mass storage device, said method comprising the steps of:

initiating operation of said file serving operating system on said plurality of network servers so that each of said plurality of network servers becomes operative to process file server requests;

initiating data mirroring from said each of said plurality of network servers to said backup network server via said means for communicating so that when a data write request is received by any of said plurality of network servers, data contained in said write request is written both to the at least one mass storage device attached to the network server which received the write request and to the at least one mass storage device attached to said backup network server by performing at least the following steps:

executing on each of said plurality of network servers a mass storage emulator program means for emulating a mass storage device so that each of said plurality of network servers appears to have at least one extra mass storage device in addition to the at least one mass storage device connected to each of said plurality of network servers; and executing on said backup network server at least one mass storage access program means for communicating with said mass storage emulation program on each of said plurality of network servers over said means for communicating and for writing data received over said means for communicating to the at least one mass storage device connected to said backup network server so that when data is written to said mass storage emulation program on any of said plurality of network servers, the data is transferred from said mass storage emulation program on said plurality of network servers to said backup network server and written to the at least one mass storage device connected thereto;

detecting failure of one of said plurality of network servers;

transferring responsibility for processing file server requests previously processed by said failed one of said plurality of network servers to said backup network server; and continuing data mirroring from the non-failed of said plurality of network servers to said backup network server.

18. A system for recovery from failure of a network server comprising:

a plurality of network servers, each comprising at least one attached mass storage device and a file server operating system, each of said plurality of network servers being adapted to process file server requests from clients;

a backup network server comprising at least one attached mass storage device;

means for communicating between at least one of said plurality of network servers and said backup network server so that data can be exchanged over said means for communicating;

wherein said at least one of said plurality of network servers comprises means for processing file server write requests in such a way that data in file server write requests is written both to said at least one mass storage device attached to said at least one of said plurality of network servers and to said backup network server via said means for communicating;

wherein said backup network server comprises means for writing data received over said means for communicating from said at least one of said plurality of network servers to the at least one mass storage device attached to said backup network server in order to mirror said data;

wherein said at least one of said plurality of network servers and said backup network server comprise means for executing a different sequence of instructions when a file server write request is processed by said at least one of said plurality of network servers so that if said at least one of said plurality of network servers encounters a software error that causes a failure, said backup network server will not encounter the same software error; and wherein said at least one of said plurality of network servers further comprises a mass storage emulation program so that said at least one of said plurality of network servers appears to have another mass storage device attached thereto in addition to said at least one attached mass storage device, and wherein said backup network server comprises a mass storage access program that is adapted to communicate with said mass storage emulation program via said means for communicating and that is adapted to write data received over said means for communicating to the at least one mass storage device attached to said backup network server.

19. A system for recovery from failure of a network server as recited in claim 18 wherein said backup network server is further adapted to process file server requests that are different from the file server requests processed by said plurality of network servers.

20. A system for recovery from failure of a network server as recited in claim 18 wherein said backup network server is adapted to automatically detect failure of one of said plurality of network servers and to initiate transfer of responsibility for processing file server requests that were previously processed by said failed network server to said backup network server.

21. A system for recovery from failure of a network server comprising:

a plurality of network servers, each comprising at least one attached mass storage device and a file server operating system, each of said plurality of network servers being adapted to process file server requests from clients;

a backup network server comprising at least one attached mass storage device;

means for communicating between at least one of said plurality of network servers and said backup network server so that data can be exchanged over said means for communicating;

wherein said at least one of said plurality of network servers is adapted to process file server write requests in such a way that data in file server write requests is written both to said at least one mass storage device attached to said at least one of said plurality of network servers and to said backup network server via said means for communicating;

wherein said backup network server is adapted to write data received over said means for communicating from said at least one of said plurality of network servers to the at least one mass storage device attached to said backup network server in order to mirror said data, and wherein said backup network is further adapted to execute different instructions when a file server request is processed;

wherein said at least one of said plurality of network servers and said backup network server execute a different sequence of instructions when a file server write request is processed by said at least one of said plurality of network servers so that if said at least one of said plurality of network servers encounters a software error that causes a failure, said backup network server will not encounter the same software error; and wherein said at least one of said plurality of network servers further comprises a mass storage emulation program so that said at least one of said plurality of network servers appears to have another mass storage device attached thereto in addition to said at least one attached mass storage device, and wherein said backup network server comprises a mass storage access program that is adapted to communicate with said mass storage emulation program via said means for communicating and that is adapted to write data received over said means for communicating to the at least one mass storage device attached to said backup network server.

22. A system for recovery from failure of a network server as recited in claim 21 wherein said plurality of network servers and said backup network server comprise different hardware configurations.

23. A system for recovery from failure of a network server as recited in claim 21 wherein said plurality of network servers comprises two network servers interconnected by means for communicating between said two network servers, each of said two network servers being adapted to process the same file server requests by executing the same sequence of instructions so that the contents of the memory and the contents of the at least one mass storage device of each of said two network servers are identical, and wherein said backup network server is connected to each of said two network servers via said means for communicating between at least one of said plurality of network servers and said backup network server.

24. A system for recovery from failure of a network server as recited in claim 21 wherein said backup network server is further adapted to process file server requests that are different from the file server requests processed by said plurality of network servers.

25. A system for recovery from failure of a network server as recited in claim 21 wherein said backup network server is further adapted to automatically detect failure of one of said plurality of network servers and to assume responsibility for processing file server requests that were previously processed by said failed network server.

26. As an article of manufacture, a computer program product comprising a computer-readable medium having program code means encoded thereon for use by a plurality of network servers and a backup network server connected together in a network configuration wherein a means for communicating is connected between each said network server and said backup network server, and each of said plurality of network servers and said backup network server comprising an attached mass storage device, said computer program code means comprising:

a mass storage emulation program means for use by said plurality of network servers, said mass storage emulation program means emulating a mass storage device and providing communication with said backup network server over said means for communicating in order to read data from or write data to the mass storage device attached to said backup network server;

a mass storage access program means for use by said backup network server, said mass storage access program means storing data on, and reading data from, said mass storage device attached to said backup network server and receiving data from a plurality of said mass storage emulation program means loaded on said plurality of said network servers, and said mass storage access program means writing said received data to the mass storage device attached to said backup network server; and wherein said mass storage emulation program means and said mass storage access program means are together operable in either of a first and second system configuration wherein the first system configuration permits said backup network server to operate solely as a backup to said plurality of network servers, whereby file server requests are not processed by said backup network server until a failure of one of said plurality of network servers occurs, and wherein said second system configuration permits said backup network server to process different file server requests from any of said plurality of network servers both prior to and after occurrence of a failure of one of said network servers.

* * * * *

UNITED STATES PATENT AND TRADEMARK OFFICE
CERTIFICATE OF CORRECTION

PATENT NO. : 5,812,748  Page 1 of 2
DATED : Sep. 22, 1998
INVENTOR(S) : Richard S. Ohran; Richard N. Rollins; Michael R. Ohran; Wally Marsden It is certified that error appears in the above-identified patent and that said Letters Patent is hereby corrected as shown below:

On the title page item [56],

Ref. Cited, US Pat. Doc., thirteenth pat. down, third col., change "Nakam" to --Nakano--

Fig. 1, change the right set of objects labeled "112" and "113" to --122-- and --123- respectively Col. 3, line 60, before "computer system" change "sever" to --server--

Col. 4, line 31, after "computer" change "become" to --becomes--

Col. 4, line 53, after "than a" change "full" to --fully--

Col. 6, line 39, after "storage" change "systems" to --system's--

Col. 12, line 14, after "systems" change "310 and 320" to --2310 and 2320--

Col. 13, lines 48-9, after "interface 2121," change "it is connected to network 2121" to --it is then connected to network 2101--

UNITED STATES PATENT AND TRADEMARK OFFICE
CERTIFICATE OF CORRECTION

PATENT NO. : 5,812,748  Page 2 of 2
DATED : Sep. 22, 1998
INVENTOR(S) : Richard S. Ohran; Richard N. Rollins; Michael R. Ohran; Wally Marsden It is certified that error appears in the above-identified patent and that said Letters Patent is hereby corrected as shown below:

Col. 14, line 43, before "has been corrected" change "110" to --2110--

Col. 14, line 44, before "backup computer" insert --the--

Signed and Sealed this

Twenty-ninth Day of February, 2000

Attest:

Q. TODD DICKINSON

Attesting Officer

Commissioner of Patents and Trademarks